US008253018B2

(12) United States Patent
Allen

(10) Patent No.: US 8,253,018 B2

(45) Date of Patent: *Aug. 28, 2012

(54) SYSTEM AND METHOD FOR LOOP DETECTOR INSTALLATION

(75) Inventor: Jim Allen, Wetumpka, AL (US)

(73) Assignee: United Toll Systems, Inc., Sarasota, FL (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/072,198

(22) Filed: Mar. 25, 2011

(65) Prior Publication Data

US 2011/0168442 A1 Jul. 14, 2011

Related U.S. Application Data

(63) Continuation of application No. 12/115,212, filed on May 5, 2008, now Pat. No. 7,952,021.

(60) Provisional application No. 60/915,886, filed on May 3, 2007.

(51) Int. Cl.
*H05K 5/00* (2006.01)

(52) U.S. Cl. ............ 174/50; 174/58; 174/100; 248/906; 439/535

(58) Field of Classification Search .................... 174/50, 174/58, 95, 98, 100; 248/906; 439/535; 220/4.02

See application file for complete search history.

(56) References Cited

U.S. PATENT DOCUMENTS

| | | | | | |
|---|---|---|---|---|---|
| 3,582,533 | A | * | 6/1971 | Albright et al. | 174/37 |
| 4,554,724 | A | * | 11/1985 | Bantz | 29/451 |
| 5,728,976 | A | * | 3/1998 | Santucci et al. | 174/135 |
| 5,739,470 | A | * | 4/1998 | Takeda | 174/97 |
| 6,116,547 | A | * | 9/2000 | Johnson et al. | 248/49 |
| 7,365,269 | B2 | * | 4/2008 | Donazzi et al. | 174/84 R |
| 7,622,669 | B2 | * | 11/2009 | Donazzi et al. | 174/36 |

* cited by examiner

*Primary Examiner* — Dhirubhai R Patel

(74) *Attorney, Agent, or Firm* — Pillsbury Winthrop Shaw Pittman LLP

(57) ABSTRACT

A pre-fabricated ferromagnetic loop having a footprint characterized by a continuous wire shaped according to a predetermined planar pattern. In some embodiments, the predetermined planar pattern can be multiple contiguous polygons within a larger footprint used for establishing a sensor for the detection of moving vehicles. The footprint may include one of a triangle, a square, a rectangle, a rhombus, a parallelogram, an ellipse, or a circle, and/or other shapes or configurations. Similarly, each of the multiple contiguous polygons may include one of a triangle, a square, a rectangle, a rhombus, a parallelogram, and/or other shapes or configurations. A loop sensor housing is arranged to enclose a continuous loop sensor wire configured in the predetermined planar pattern. The prefabricated loop sensor is inserted in a groove web pre-cut in a receiving medium to match the predetermined planar pattern.

20 Claims, 19 Drawing Sheets

SYSTEM AND METHOD FOR LOOP DETECTOR INSTALLATION

RELATED APPLICATIONS

The present application is a continuation of U.S. patent application Ser. No. 12/115,212, filed May 5, 2008, which in turn claims priority from U.S. Provisional patent application No. 60/915,886, filed May 3, 2007, both of which are hereby incorporated by reference into the present application in their entirety.

FIELD OF THE INVENTION

The invention relates generally to detection, identification, and classification of metallic objects, and more particularly, to a system and method for efficient installation of ferromagnetic loops on traveling surfaces.

BACKGROUND OF THE INVENTION

Applicants reference U.S. patent application Ser. No. 10/953,858, filed Sep. 30, 2004 ("the '858 application"), which is a continuation of U.S. patent application Ser. No. 10/206,972, (the '972 application, now U.S. Pat. No. 6,864, 804), which is a continuation-in-part application of U.S. patent application Ser. No. 10/098,131, filed Mar. 15, 2002 ("the '131 application"), which is a continuation-in-part application of U.S. patent application Ser. No. 09/977,937 ("the '937 application"), filed Oct. 17, 2001 (now U.S. Pat. No. 7,136,828). All of the above patents and patent applications are hereby incorporated herein by reference in their entirety.

The presence or passage of vehicles on roadways or other information regarding vehicles on roadways can be monitored with a combination of loop detectors, treadles, or other such devices capable of detecting passing vehicles. These devices may be used to detect vehicles in toll collection stations, stoplights, or in other applications. These devices may provide vehicle classification information as vehicles pass along a roadway.

One example of the use of such devices is a toll collection system such as, for example, that described in the '972 application referenced above. The '972 application relates to an intelligent vehicle identification system (IVIS) that includes one or more inductive loops. The inductive loops disclosed in the '972 application includes signature loops, wheel assembly loops, intelligent queue loops, wheel axle loops, gate loops, vehicle separation loops, and enforcement loops.

Key elements of the ferromagnetic loops disclosed in the '972 application include the magnetic strength of the flux field, height and length. The flux field created by the loop circuit is concentrated and low to the road surface to maximize the ferromagnetic effect of the wheel assemblies and minimize the eddy currents created by vehicle chassis. Shallow installation of a wire used to form loop sensors, such as ferromagnetic loop sensors, may be important for optimal performance of the ferromagnetic loop design.

Since loop sensors, such as ferromagnetic loop sensors, are arranged in the bed of a roadway, permanent installation of the sensors typically entails cutting into the roadbed to provide a space to house the loop sensors. Referring now to FIGS. 12, 13, and 14 (which correspond to FIGS. 31b, 41 and 50 from the '972 application, respectively), the roadbed may be cut in a predetermined pattern according to the desired shape of the loop sensor, such as the pattern shown in FIG. 14. FIG. 14 illustrates loop sensors 5010, 5020, and 5030 connected to loop detector 5002. A narrow groove is cut to house the wire, as illustrated in FIG. 12, where wire 3118 is housed in a groove 3130 of pavement 3102. One method of installation involves installing the wire within one inch of the road surface as shown in FIG. 13. Groove depth 4108 in FIG. 13 is in the range of one inch. Wire turns 4102 and 4104 can be accommodated within a groove.

The above installation method requires cuts to be made into a web of grooves (also termed "groove web" hereinafter) in the shape of the loop sensor. In addition, after grooves are cut, it is necessary to lay a continuous sensor wire in a serpentine manner within the groove web to form the desired sensor shape. It may also be necessary to secure the continuous wire within the web of grooves, for example, using a bonding agent. In addition, the step of laying the continuous sensor wire can involve laying two or more turns in the groove pattern, as illustrated in FIG. 13. The above procedure can entail considerable time and difficulty, causing a travel lane to be inoperable for a considerable time. In addition, control of position of the sensor within a groove web can be difficult. For example, as indicated in FIG. 12, a groove width must be somewhat larger than a sensor wire diameter, leaving room for the sensor wire to shift within the groove during laying of the wire. In particular, as described in the '972 application, in order to control the induction loop properties, it is important to control the depth of the sensor wires with respect to a surface in which they are embedded. Inadvertent variations in the sensor loop wire depth incurred in the above process during wire laying, can cause unwanted changes in the loop properties. Additionally, variation in loop properties from sensor to sensor can be expected for induction loop sensors fabricated with nominally the same pattern, groove depth, and wire arrangement.

In light of the foregoing, it will be appreciated that a need exists to improve loop sensor installation.

SUMMARY

The invention provides a system and method for installing a loop, such as a ferromagnetic loop for detection of vehicles. In some embodiments, the invention provides configurations, designs, and methods of installation, and other characteristics associated with the loops of the '972 application or other loops or devices. For example, in some embodiments, the systems and methods of the invention may be utilized to improve one or more of the loops disclosed in the '972 application, among other things.

In some embodiments of the invention, a pre-fabricated loop sensor may include a loop sensor housing that is used to house a loop sensor wire used to detect vehicles. In some embodiments, the loop sensor housing is a plastic material such as, for example, a formable thermoplastic material or any suitable material. The loop sensor housing may be configured to impart a planar shape to the loop sensor wire that coincides with a predetermined loop sensor pattern. The loop sensor pattern can be chosen from any pattern according to the desired detection properties of a finished loop sensor containing metallic loops arranged in the loop sensor pattern. Exemplary sensor patterns may include an overall outer shape or "footprint" arranged in a triangle, a rectangle, a square, a circle, an ellipse, a rhombus, a parallelogram, or other shape or configuration. In some embodiments, the pattern may form multiple contiguous polygons within the footprint. In some embodiments, each of the multiple contiguous polygons can assume one of several shapes. For example, each of the contiguous polygons can be one of a rectangle, a square, a rhombus, a parallelogram, or other shape or configuration. In some embodiments, there may be at least three contiguous polygons within the footprint. The contiguous polygons may be parallel, perpendicular, or at an angle with respect to the axis of the footprint.

In some embodiments, the loop sensor housing when fully assembled assumes a cross-sectional shape and size adapted to easily fit within pre-cut grooves in a road surface layer.

The pre-fabricated loop sensor may further include a continuous loop sensor wire designed to act as an induction loop detector. In some embodiments, the wire is ferromagnetic material designed for induction loop detectors. The loop sensor wire is housed within a hollow portion of the loop sensor housing.

In some embodiments, the loop sensor housing may comprise a continuous piece having a planar shape that coincides with the planar shape of the web groove into which the housing is inserted. The planar housing may be configured to encapsulate substantially the entire length of a loop sensor wire place therein. Thus, both loop sensor housing and sensor wire may assume a common shape matched to a web groove designed to house the fully assembled loop sensor.

In some embodiments, the loop sensor housing may comprise separate housing segments, where each housing segment is designed to contain and guide a portion of the loop sensor wire. When the prefabricated loop sensor is assembled, the separate loop sensor housing segments and the loop sensor wire may assume a planar element whose pattern substantially matches a web groove into which the loop sensor is to be placed. In some embodiments, the separate segments may form a quasi-continuous piece during assembly of the prefabricated loop sensor, by abutting the segments one against each other and placing the loop sensor wire through each segment.

In some embodiments, the loop sensor housing may include partially separable portions that accommodate insertion of loop sensor wire therebetween. In the case of a prefabricated loop sensor having a continuous loop sensor housing, the partially separable portions are integral to the continuous housing. In the case of a prefabricated loop sensor having separate housing segments, one or more of the segments contain partially separable portions integral to that segment. A hollow portion of the housing may be configured to accommodate loop sensor wires wound according to a predetermined pattern. In some embodiments, when fully assembled, the housing provides a plurality of wire guides, arranged according to a predetermined wire guide pattern. The wire guide pattern can contain wire guides stacked one on top of another, so that the prefabricated loop sensor can contain one or more stacked wires. In some embodiments, the wire guide pattern can contain wire guides arranged side-by-side.

In some embodiments, the loop sensor housing may include a fastening portion to fasten together the partially separable portions. In some embodiments, the fastening portion comprise a piece separate from the partially separable portions used to hold the latter portions together. In some embodiments, the fastening portion may be integral to the partially separable portions.

In some embodiments, the loop sensor housing may include a deformable side portion that holds the housing in place when inserted in a groove. In some embodiments, the deformable side portion is configured in an initial size larger than a groove width into which it is placed, and is substantially deformable so that the housing fits snugly within the groove after placement. The loop sensor housing may further include a top retaining portion (or "lip") that extends over a surface into which the grooves are cut, providing further stability for the prefabricated loop sensor, and assuring that ferromagnetic loop wires within the housing are located at a fixed distance from the road surface, once the loop sensor is inserted into a groove.

In some embodiments, the pre-fabricated loop sensor may include a connector extending from one region of the loop sensor wires, to provide easy connection to a loop detector used to process signals generated by the loop sensor.

Accordingly, the pre-fabricated loop sensor of the invention can be quickly fitted into place and rendered operational in a precut groove web having a predetermined ferromagnetic loop sensor pattern, thus minimizing time and installation effort in the "field."

In some embodiments, the invention provides a method for installing a loop sensor. In some embodiments, the method for installing a loop sensor includes configuring a prefabricated loop sensor according to a predetermined planar pattern. The predetermined planar pattern may be any pattern desired for a loop sensor. The predetermined planar pattern may correspond to a planar arrangement of a loop sensor to be fabricated using a loop sensor housing. A loop sensor wire may be enclosed in the loop sensor housing. In some embodiments, the set of wires is enclosed within a hollow portion defined by partially separable portions. In some embodiments, the partially separable portions are opened and a wire inserted therein. The partially separable portions are rejoined by securing the partially separable portions at an end region. In some embodiments, the partially separable portions are secured using a fastener.

In some embodiments, the loop sensor housing is a continuous piece having a planar shape of the predetermined planar pattern. In some embodiments, the loop sensor housing comprises separate housing segments that are arranged to contain and guide the loop sensor wire in a manner that maintains a planar shape that together with the loop sensor wire is the same as the predetermined planar pattern.

A web of interconnected grooves may be cut in a roadway according to the predetermined pattern. The prefabricated loop sensor including the loop sensor housing and the loop sensor wire is placed over the groove web. The prefabricated loop sensor housing is oriented over the groove web so that the patterns of the groove web and loop sensor match. The prefabricated loop sensor is inserted into the groove web by pressing the loop sensor housing therein, thereby securing the loop sensor wire within the groove web at a predetermined location with respect to the surface of the groove web.

DETAILED DESCRIPTION

Elements of the ferromagnetic loops of the invention include the magnetic strength of flux field height and length. The shallow installation of wire and wire orientation of the coil in loop installations is important for optimal performance of the ferromagnetic loop design. The flux field created by the loop circuit is concentrated and low to the road surface to maximize the ferromagnetic effect of the wheel assemblies and minimize the eddy currents created by vehicle chassis.

As discussed in the '972 application in detail, the geometry of the loop wire turnings in a prefabricated loop sensor can be oriented in different directions relative to the direction that vehicles travel in order to vary the response of the loop sensor to the vehicle wheels. Accordingly, prefabricated loop sensors of the present invention can assume any designed geometry, including those designed to produce a specific response.

Figure 1:
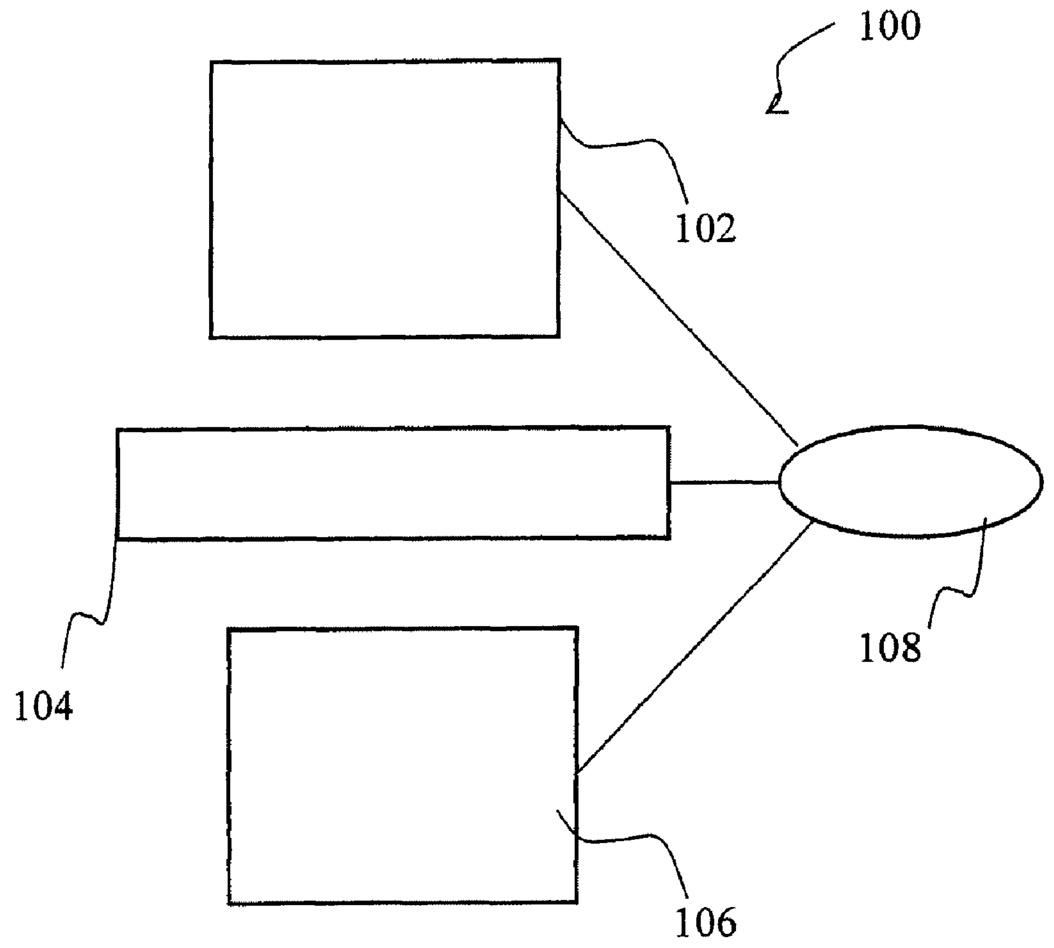
FIG. 1 illustrates a plan view of a loop sensor system configured according to various embodiments of the invention.

FIG. 1 illustrates a plan view of a loop sensor system 100, configured according to various embodiments of the invention. In system 100, loop sensors 102, 104, and 106, illustrated in plan view, may be prefabricated loop sensors, configured according to methods described below. For example, each prefabricated loop sensor may be placed in a precut slot in pavement (not shown) having substantially the same planar pattern as the sensor. In other words, a prefabricated loop sensor may be patterned as a set of co-planar loops that, when lying in a horizontal plane, form the same horizontal pattern that is pre-cut in the pavement. In the case of prefabricated loop sensors 102, 104, and 106, each may comprise a single orthogonal loop. However, in some configurations, prefabricated loop sensors may include multiple loops such as, for example, multiple contiguous polygons (see e.g., loops sensors of the '972 application) or other shapes. Prefabricated loop sensors 102, 104, and 106 can be installed at the same time or separately. Loop detector 108, can be installed at the same time or separately from prefabricated loop sensors 102, 104, and/or 106. Once installed in pavement, prefabricated loop sensors 102, 104, and/or 106 can be connected to loop detector 108 through connectors provided in a periphery region of each sensor. While the loop sensors illustrated in FIG. 1 comprise rectangular shapes, other configurations such as, for example, other polygonal or non-polygonal shapes may be used.

Figure 1A:
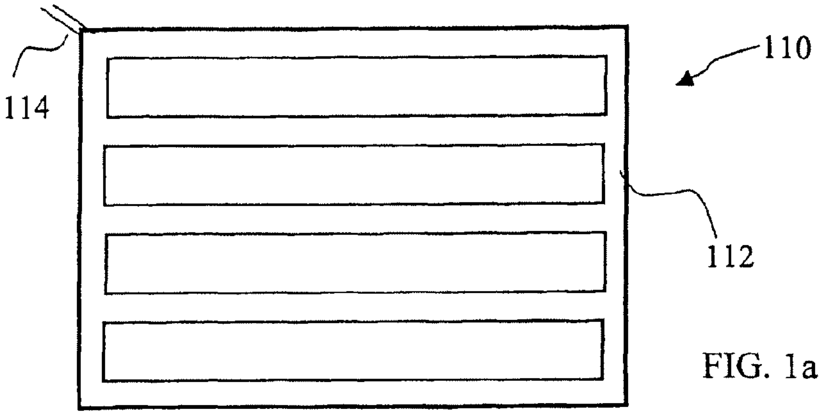
FIG. 1*a* is a plan view of a prefabricated loop sensor, arranged according to various embodiments of the invention.
Figure 1B:
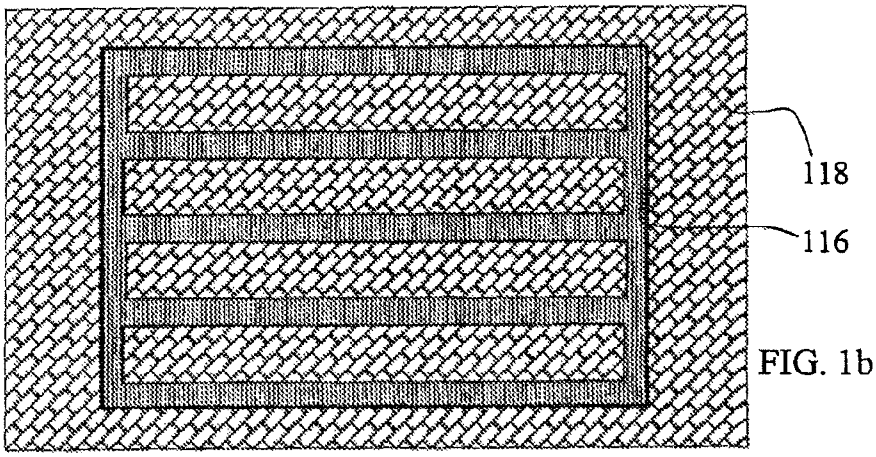
FIG. 1*b* illustrates a web groove configured in the shape of the prefabricated loop sensor of FIG. 1.
Figure 1C:
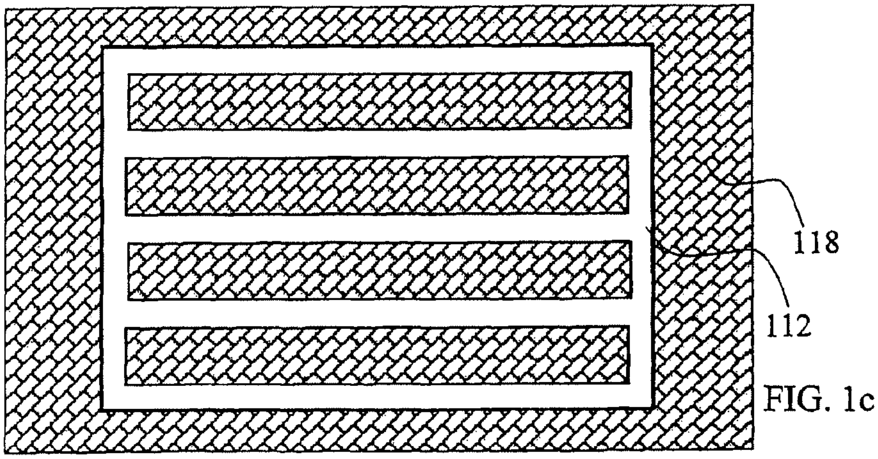
FIG. 1*c* illustrates a prefabricated loop sensor assembled in a web groove, according to various embodiments of the invention.
Figure 1D:
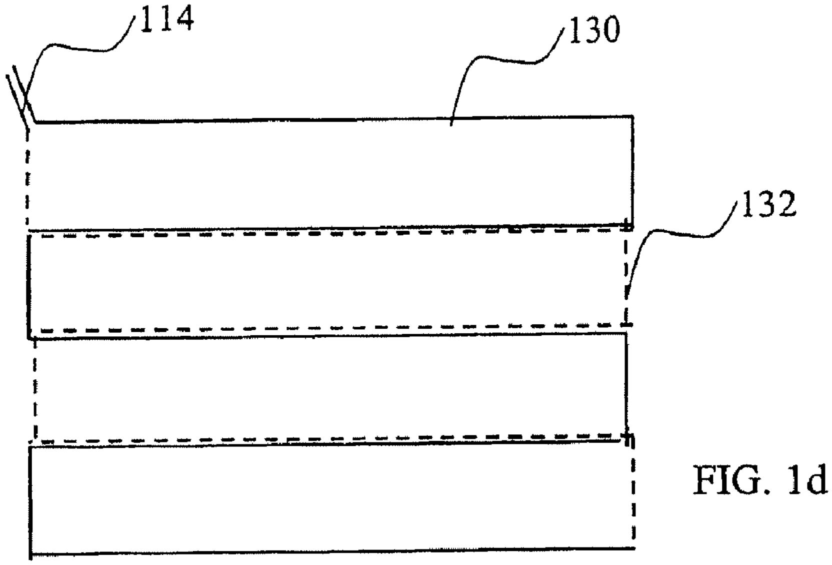
FIG. 1*d* illustrates details of a loop sensor wire, arranged according to various embodiments of the invention.

FIG. 1*a* illustrates a plan view of a prefabricated loop sensor (PLS) 110, arranged according to one embodiment of the present invention. PLS 110 may include loop sensor housing 112 and loop sensor wire 114. In the arrangement illustrated in FIG. 1*a*, loop sensor housing 110 substantially encloses loop sensor wire 114, save for a portion in the upper left corner. One possible configuration of loop sensor wire 114, which is substantially hidden in FIG. 1*a* by loop sensor housing 112, is illustrated in FIG. 1*d*. The shape of loop sensor housing 112 as viewed in plan view, is configured to match the shape of a groove web 116 cut into receiving medium 118, illustrated in FIG. 1*b*. For example, a pavement saw can be used to cut slots in a roadway, the dimensions of which may be for example, about 0.25 to 1.0 inch wide by about 1 to 4 inches deep. Receiving medium 118 is preferably a surface region of a roadway used to collect vehicle data (e.g., a tolling area or other area). As illustrated in FIG. 1*c*, by arranging the orientation of PLS 110 to match that of groove web 116, a quick, highly controlled, and high quality installation can be performed by pressing PLS 116 therein. A loop sealant or another bonding agent can be used to further secure the PLS in the saw cut. Although illustrated as a single piece in FIG. 1*a*, loop sensor housing 112 may also be a series of contiguous housing segments assembled to form a quasi-continuous housing.

FIG. 1*d* illustrates details of loop sensor wire 114, arranged according to various embodiments of the invention. As illustrated in FIG. 1*d*, loop sensor wire 114 includes a first serpentine winding 130 (depicted in solid lines) and a second serpentine winding 132 (depicted in dashed lines), together defining a series of four contiguous polygons (other shapes or configurations may be used). Because loop sensor wire 114 is placed within loop sensor housing 112, PLS 110 can be quickly assembled in a precut web groove, for example web groove 116, so that time and effort expended in a data collection location installing an operational induction loop sensor is minimized. For example, the configuration of PLS 110 avoids time that would otherwise be spent winding a loop sensor wire such as wire 114 within a groove web, such as groove web 116. This provides the further advantages that traffic delay during sensor installation in a roadway is shortened, safety enhanced, and cost reduced to traffic being diverted elsewhere or uncharged during a lengthy installation is minimized.

Figure 2:
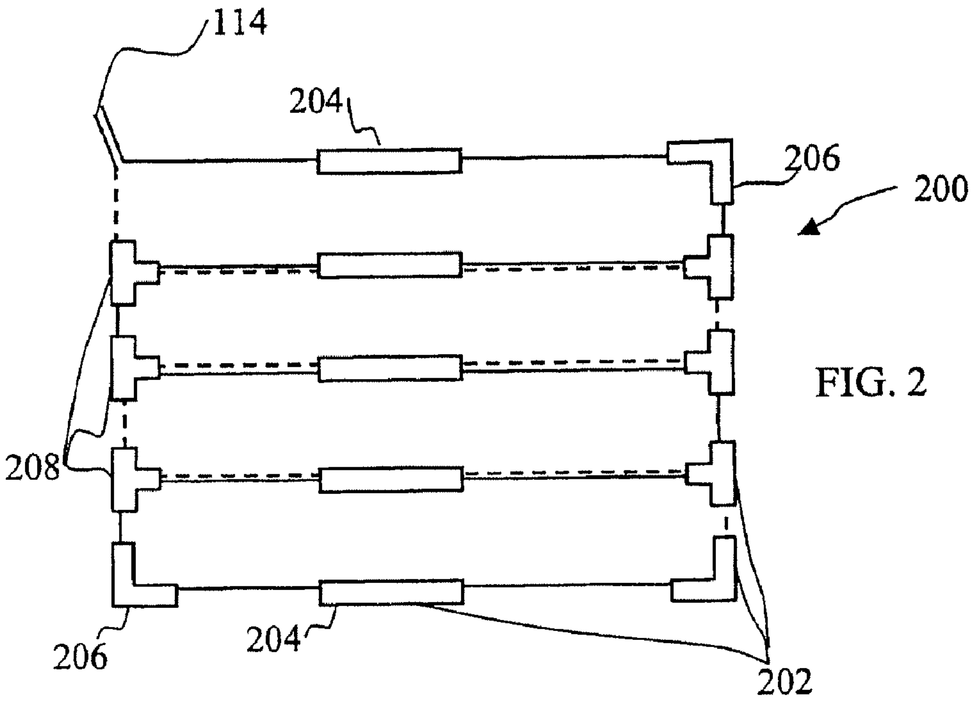
FIG. 2 illustrates a prefabricated loop sensor arranged according to various embodiments of the invention.
Figure 2A:
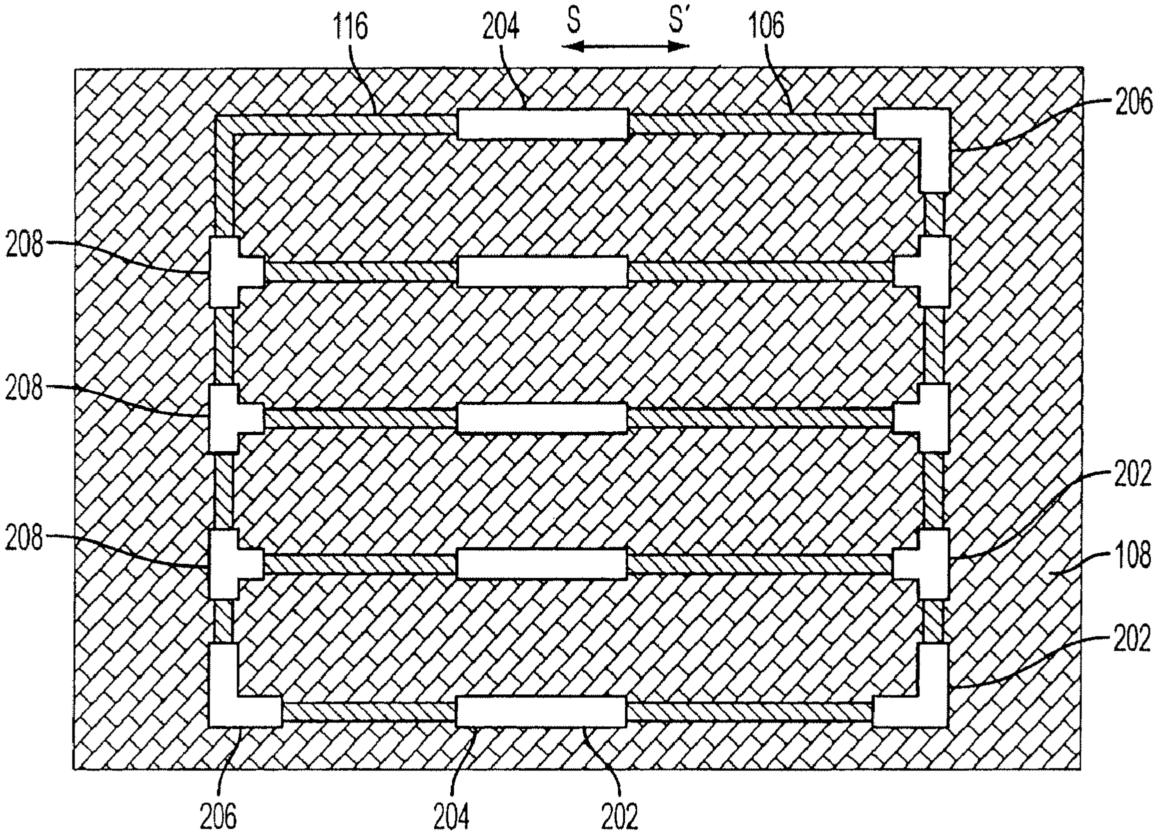
FIG. 2*a* illustrates a prefabricated loop sensor assembled in a web groove, according to various embodiments of the invention.

FIG. 2 illustrates PLS 200 arranged according to various embodiments of the invention. As illustrated in FIG. 2, loop sensor housing 202 includes isolated housing segments including straight segments 204, corner segments 206 and T-segments 208. Housing segments 204, 206, and 208 together with loop sensor wire 114 are configured to maintain and/or impart a planar shape to PLS 200 substantially the same as that of PLS 100. Even though loop sensor housing 202 includes separate segments, the housing segments of loop sensor housing 202 enclose loop sensor wire 114 in parts and help maintain a planar shape similar to that of PLS 100. Accordingly, as illustrated in FIG. 2*a*, PLS 200 can be placed within groove web 116. An advantage of this embodiment is that, by sliding one or more of segments 206, 204, and/or 208 with respect to loop sensor wire 114, for example, along direction "S-S'" slight adjustments to the overall dimensions of PLS 200 can be made as needed when PLS 200 is inserted in a groove web.

In some embodiments, loop sensor housing segments may include interlocking segments that together form a continuous or semi-continuous housing in a predetermined pattern. The segments may include elongated straight segments with an L or T component at one or more ends. As such, various combinations of these segments may be used to form a continuous or semi-continuous loop sensor housing.

In some embodiments, a loop sensor housing such as, for example, loop sensor housing 202, may be comprised of a is a plastic material, such as PVC or any materials that allow deformation. Furthermore, in some embodiments, a loop sensor housing may include elements that fit together using interlocking elements such as barbs, hooks, or other elements.

Figure 3:
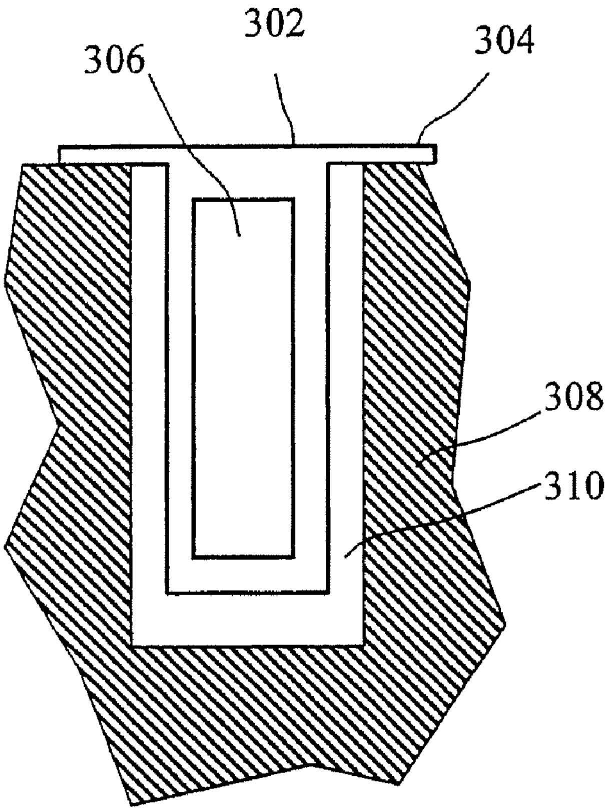
FIG. 3 illustrates a cross-sectional view of a loop sensor housing, arranged according to various embodiments of the invention.
Figure 3A:
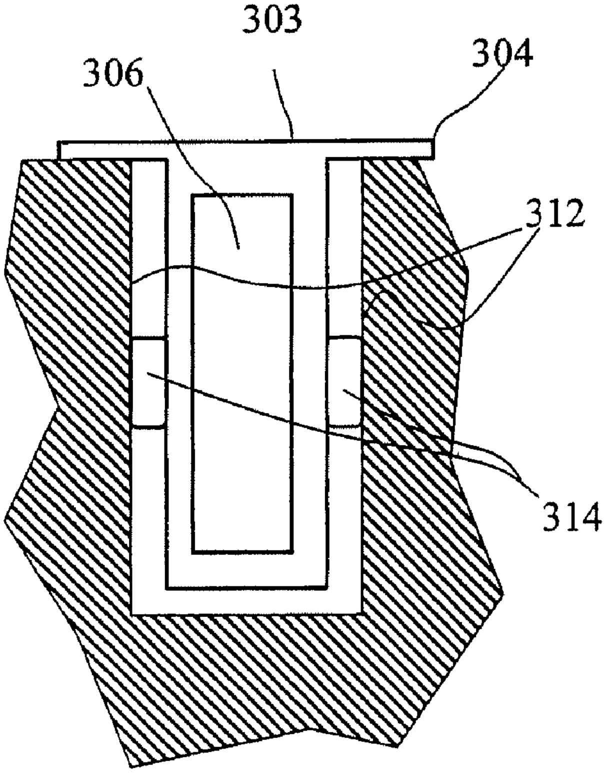
FIG. 3*a* illustrates a cross-sectional view of a loop sensor housing, arranged according to various embodiments of the invention.

FIG. 3 illustrates a cross-sectional view of a loop sensor housing 302, according to various embodiments of the invention. Loop sensor housing 302 includes retaining lip 304 that engages a surface of receiving medium 308 when loop sensor housing 302 is inserted in groove 310, causing retaining lip 304 to come to rest on top of receiving medium 308. Hollow region 306 is configured to enclose loop sensor wires. In the embodiment illustrated in FIG. 3*a*, loop sensor housing 303 includes deformable side portions 314 that contact sidewall 312 when loop sensor housing is placed within groove 310.

Figure 4:
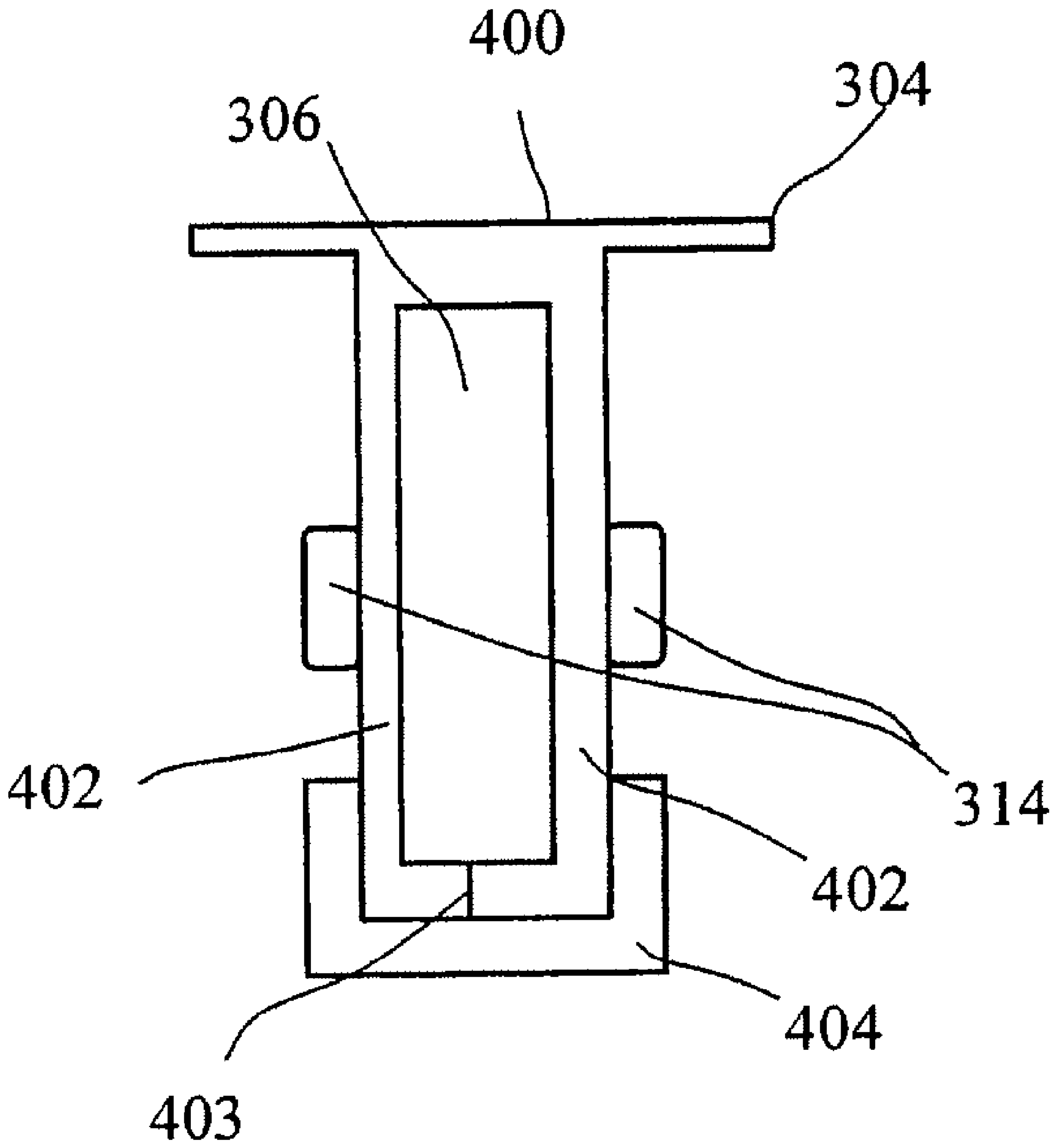
FIG. 4 illustrates a cross-sectional view of a loop sensor housing, arranged according to various embodiments of the invention.

FIG. 4 illustrates a cross-sectional view of a loop sensor housing 400, according to various embodiments of the invention. Loop sensor housing 400 includes portions 402 that may be partially separated in region 403 to allow convenient placement of wires within hollow region 306. Fastener 404 may be provided to help ensure that separable portions 402 remain closed when, for example, a loop sensor wire is placed within loop sensor housing 400.

Figure 5:
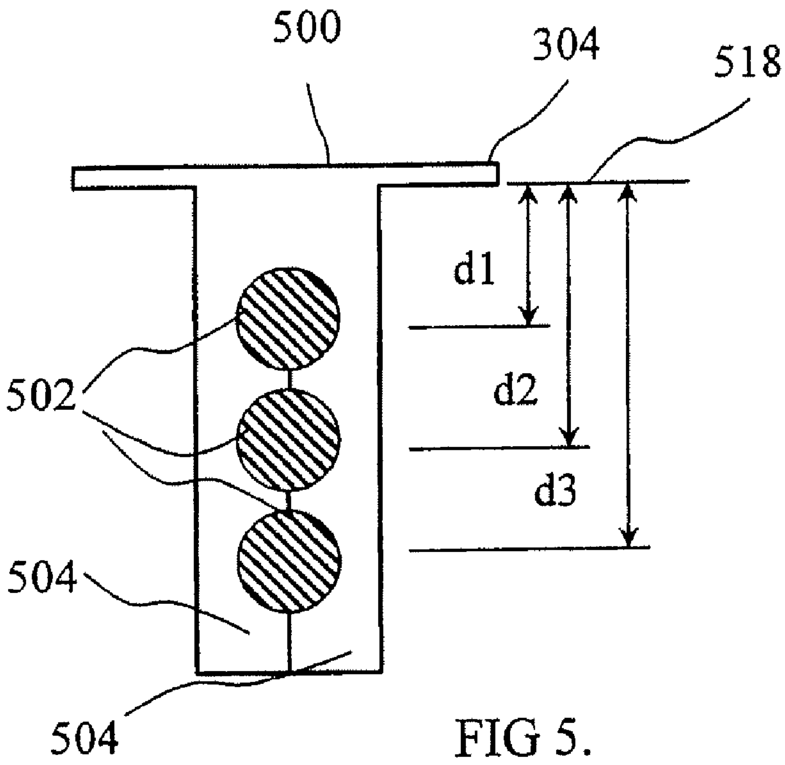
FIG. 5 illustrates a cross-sectional view of a loop sensor housing, arranged according to various embodiments of the invention.

FIG. 5 illustrates a cross-sectional view of a loop sensor housing 500, according to various embodiments of the invention. A hollow portion of loop sensor housing 500 may be configured as a series of vertically stacked wire guides 502 that can each contain a portion of loop sensor wire. For example, loop sensor wire 114 in some regions may include multiple wire tunas, while in other regions may include a single wire turn, as illustrated in FIG. 1*d*. Accordingly, loop sensor housing 500 can be used to accommodate loop sensor wire 114. In regions where two or more windings are present, the windings pass through two or more guides of housing 500, while only one guide is employed in regions where a single winding exists. Loop sensor wires can be conveniently placed through loop sensor housing 500 by separating portions 504.

Figure 5A:
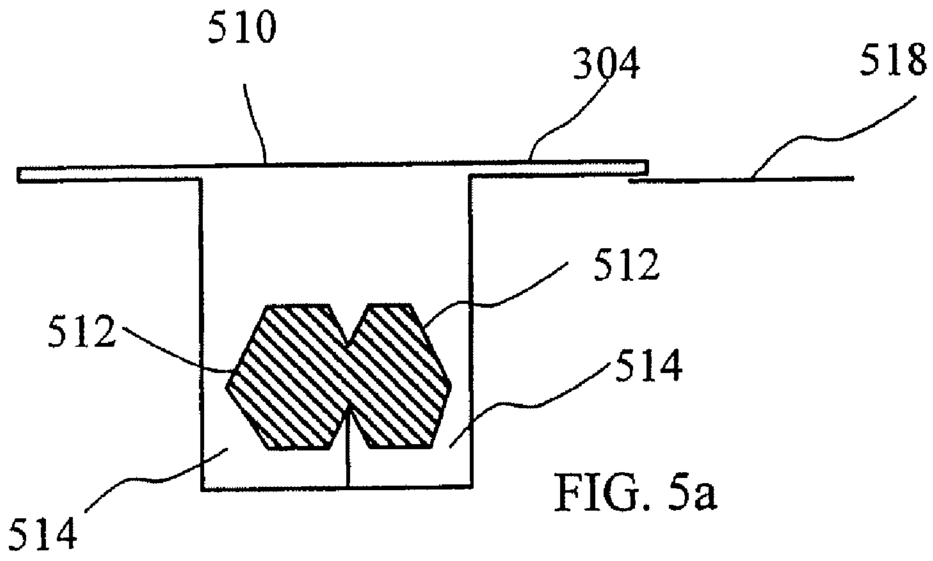
FIG. 5*a* illustrates an alternative arrangement of wire guides in a loop sensor housing, according to various embodiments of the invention.

In some embodiments, for example, those illustrated in FIG. 5*a*, wire guides 512 may be arranged side-by-side in loop sensor housing 510, and loop sensor wires (not shown) can be placed therein by separating portions 514.

Loop sensor housing 500 and 510 both enable a precise location of a loop sensor wire to be established with respect to a surface, as discussed in more detail below. As illustrated for FIG. 5, each configuration, by providing a top surface retaining lip (e.g., 304), as well as wire guides at a fixed position with respect to the retaining lip (e.g., 502), defines one or more depths (e.g., d1, d2, d3) at which wires can be located with respect to the top surface 518 of a groove cut in a roadbed surface, when the respective loop sensor housing containing loop sensor wires is placed therein.

Figure 6:
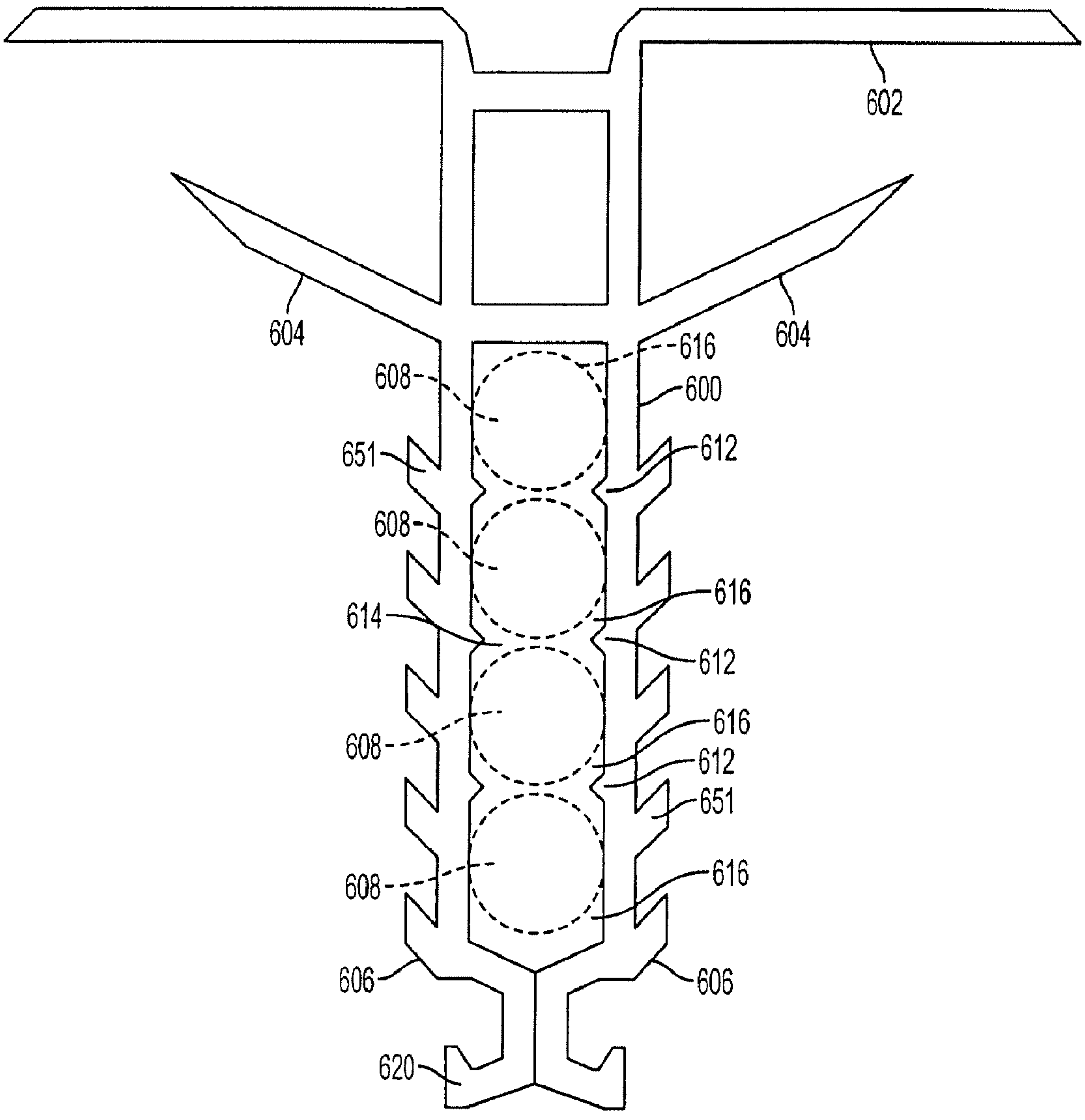
FIG. 6 illustrates a cross-sectional view of a prefabricated loop sensor portion, according to various embodiments of the invention.
Figure 6A:
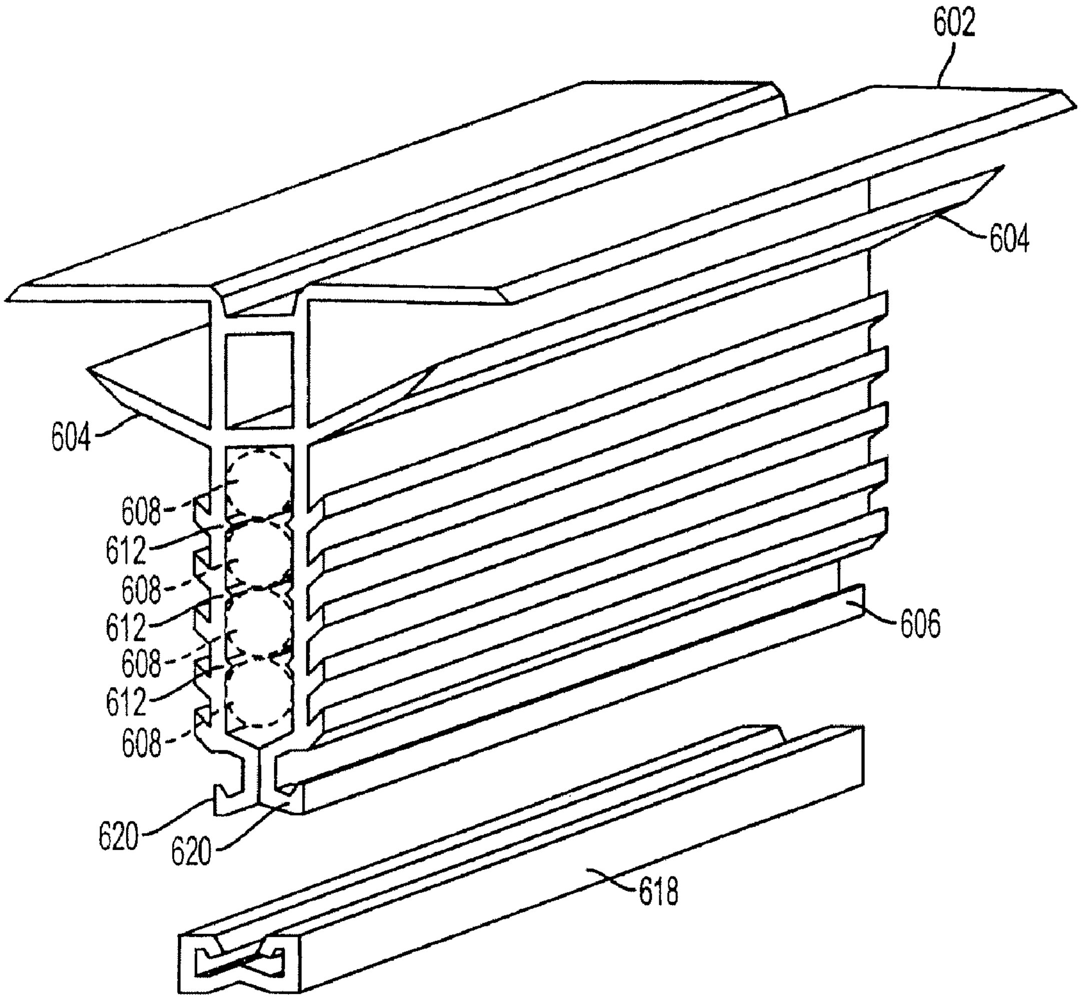
FIG. 6*a* illustrates a perspective view of a prefabricated loop sensor portion, according to various embodiments of the invention.
Figure 6B:
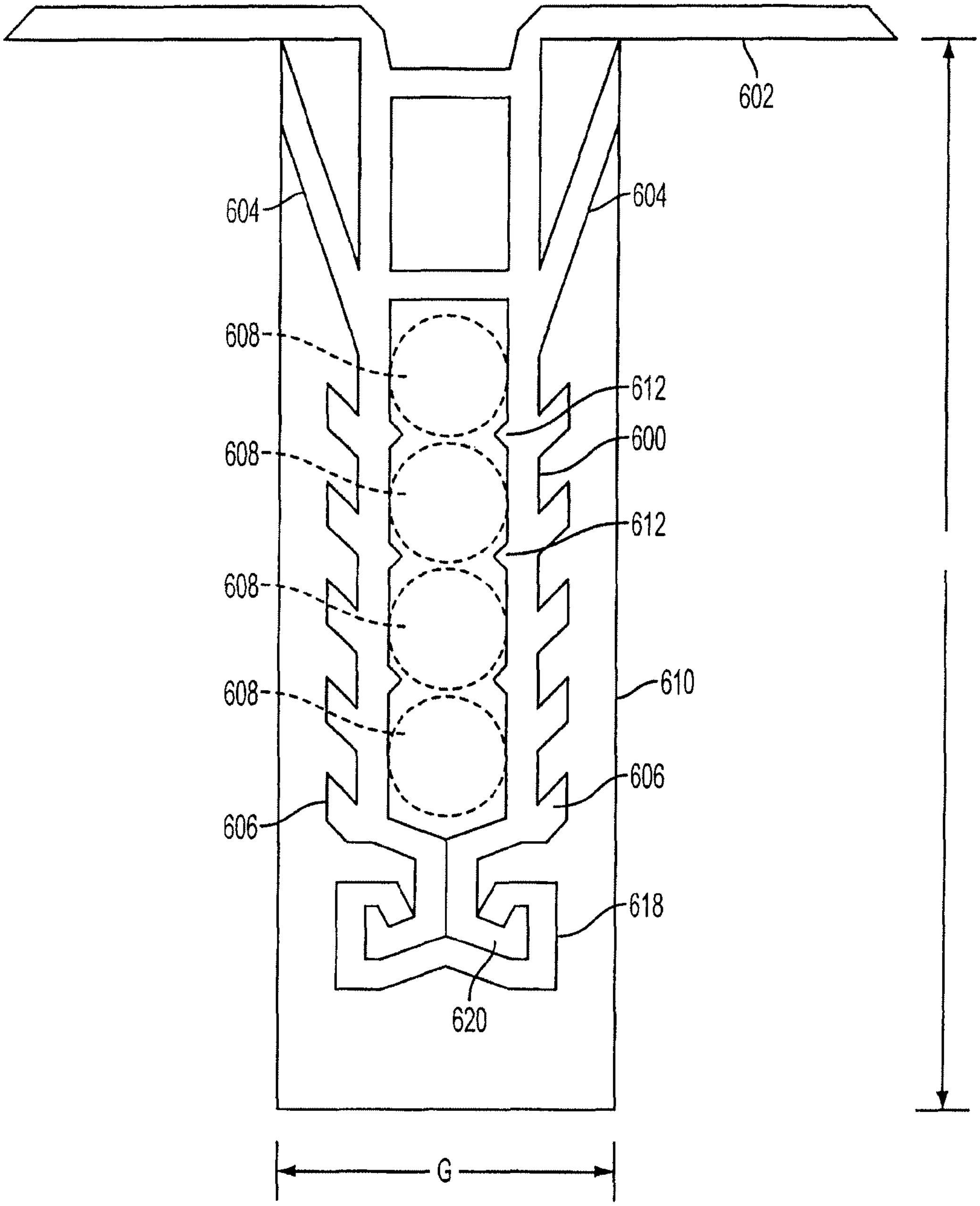
FIG. 6*b* illustrates deformation of deformable side portions of a prefabricated loop sensor, according to various embodiments of the present invention.

FIGS. 6 and 6*a* illustrate a cross-sectional view and perspective view, respectively, of PLS portion 600, according to various embodiments of the invention. PLS portion 600 may be an individual housing segment (together with loop sensor wire) or a section of a continuous housing. PLS portion 600 includes retaining lip 602 (which may aid in leveling PLS portion 600 with respect to a roadway surface and/or provide other features), deformable side portions 604 (which may aid in centering PLS portion 600 in a center of a groove and/or provide other features), partially separable portions 606, and wire guides 612 containing wires 608. As illustrated in FIG. 6*b*, deformable side portions 604 are configured as side arms whose distal end can be bent in an upward and inward direction with respect to the rest of the housing when housing portion 600 is inserted in a web groove 610. A force established by the upwards deformation can act to secure housing portion 600 against movement. Furthermore, deformable side portions 604 may aid in centering PLS portion 600 in a groove or may provide other features.

Figure 6C:
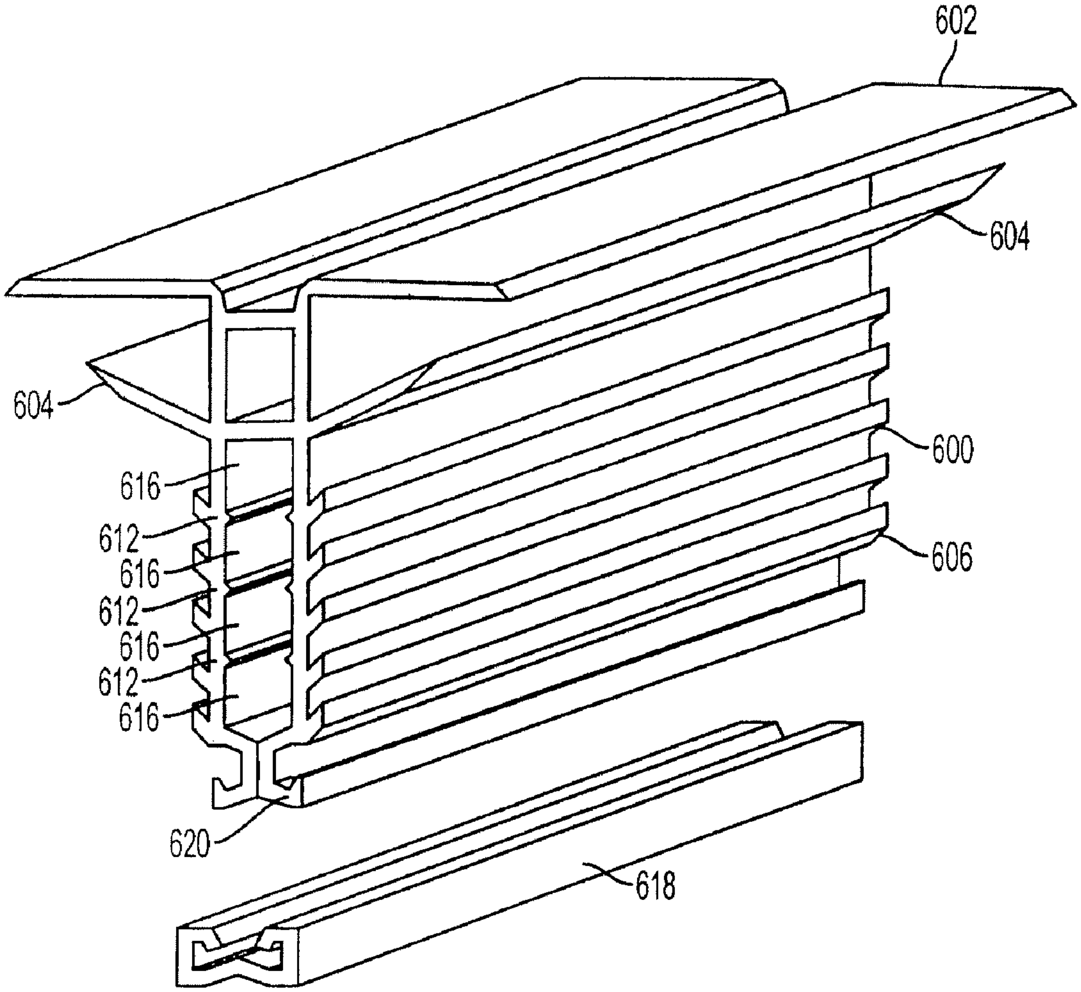
FIG. 6*c* illustrates a loop sensor housing portion with empty wire guides according to various embodiments of the invention.

In some embodiments, wire guides 612 may include small triangular bumps disposed along sidewalls of hollow portion 614. Loop sensor wires 608 of an appropriate diameter are constrained within wire retaining regions 616 as indicated by comparison of FIG. 6*a*, showing wires 608 contained in wire guides 612, with FIG. 6*c*, showing housing portion 601 with empty wire guides. Wires can be conveniently placed in wire guides 612 by pulling separable portions 606 apart.

FIGS. 6*a*-6*c* also illustrate fastener 618 that holds separable portions 606 together when attached at end region 620. Fastener 618 can be affixed to housing portion 600 by relative upwards motion from the bottom side or by sliding on in the case where housing portion constitutes an isolated segment.

FIG. 6 illustrates protrusions 651, which may aid in securing and/or locking PLS portion 600 into place into a groove in conjunctions with a sealant, epoxy, and/or other adhesive-like substance.

Figure 7A:
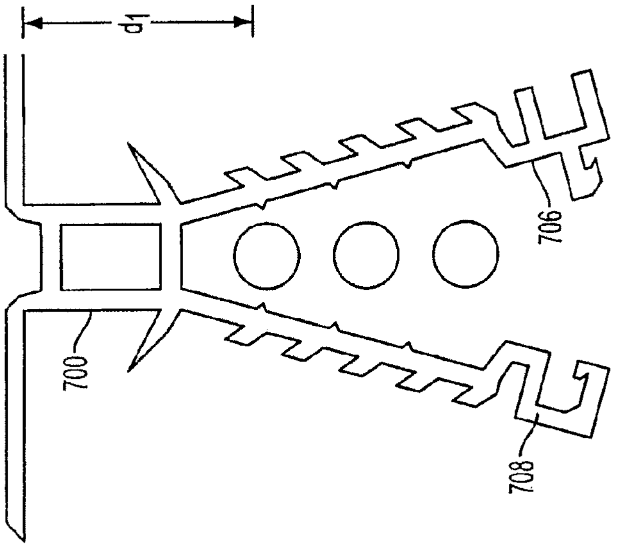
FIG. 7*a* illustrates a cross-sectional view of a loop sensor housing portion of a prefabricated loop sensor, arranged according to various embodiments of the invention.
Figure 7:
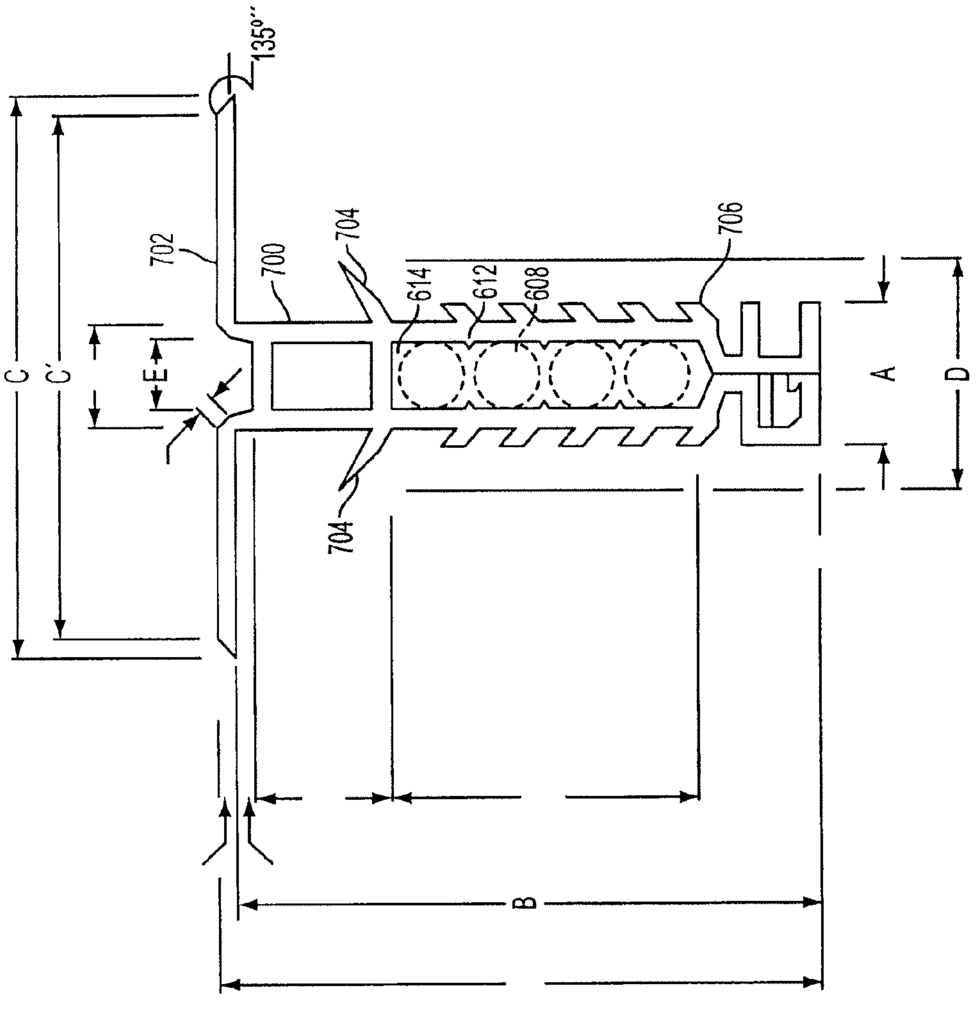
FIG. 7 illustrates a cross-sectional view of a loop sensor housing portion of a prefabricated loop sensor, arranged according to various embodiments of the invention.

FIGS. 7 and 7*a* illustrate a cross-sectional view of a loop sensor housing portion 700 of a PLS, according to various embodiments of the invention. Loop sensor housing portion 700 may include wire guides 612, configured to contain wires 608, as illustrated in FIG. 7. Loop sensor housing portion 700 may be an individual housing segment (together with loop sensor wire) or a section of a continuous housing. In some embodiments, loop sensor housing portion 700 may include a female separable portion 708 that is configured to lock with male separable portion 706, by inward rotation, as indicated by comparison of FIG. 7*a* with FIG. 7. In some embodiments, when decoupled, separable portions 706 and 708 may assume an open position as indicated in FIG. 7*a*, absent external force. This may enable convenient insertion of wires into loop sensor housing portion 700, where only a single closing motion need be applied to the housing.

Figure 8:
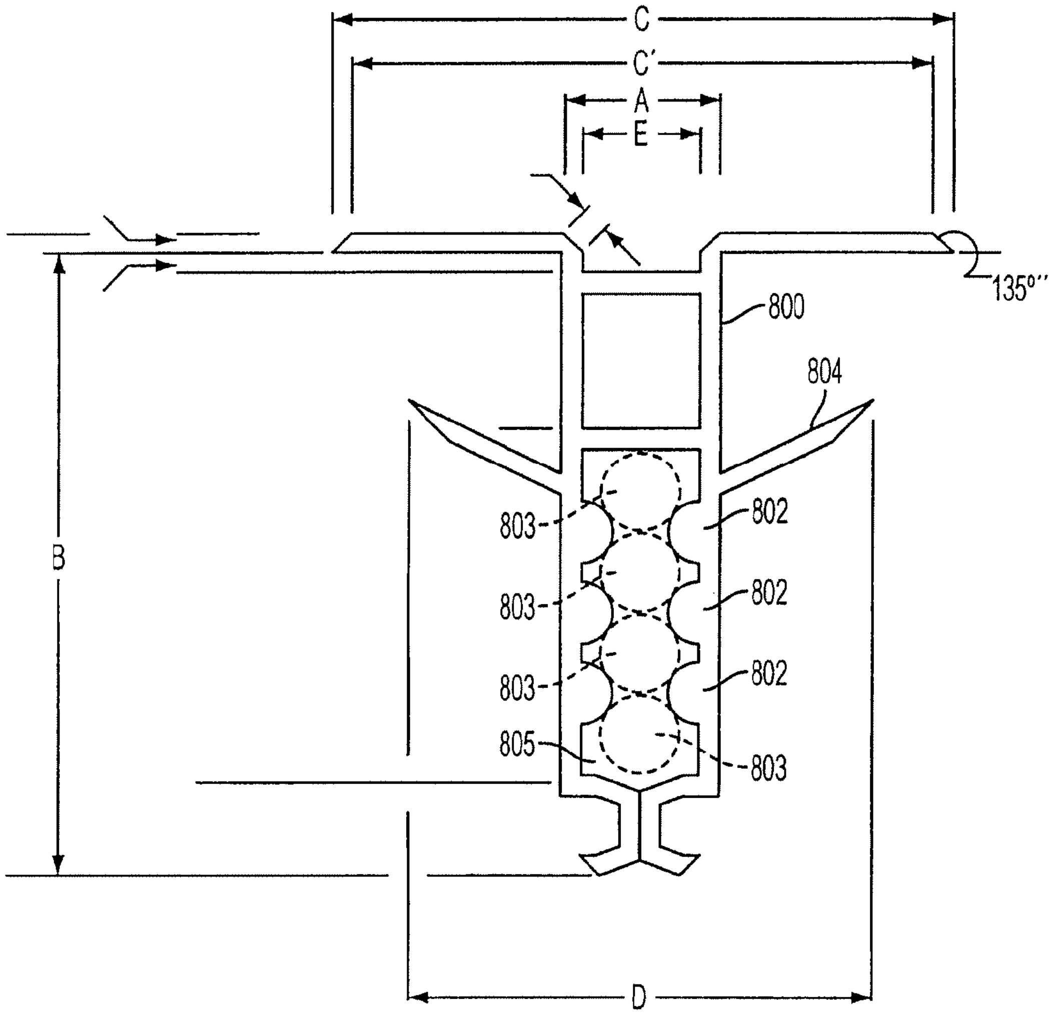
FIG. 8 illustrates a sensor loop housing, arranged according to various embodiments of the invention.

FIG. 8 illustrates a sensor loop housing 800, arranged according to another embodiment of the present invention. In this embodiment, wire guides 802 containing wires 803 may comprise hemispherical protrusions in hollow portion 805.

Referring to FIGS. 6, 7, and 8, a main housing width A (see FIG. 8) of loop sensor housing portions 600, 700 and 800 may be about one eighth to one half inch, or may be about one quarter inch. Other dimensions may be used. In some embodiments, depth B (see FIG. 8) of loop sensor housing portions 600, 700 and 800 of FIGS. 6, 7, and 8, respectively, may be about three quarters inch to one and one quarter inch, and in some embodiments about one inch, but could be 4 inches or more. Other dimensions may be used. In some embodiments, a width E of hollow portion 614 (or 804) may be about one eighth to one half inch. Other dimensions may be used. In some embodiments, a width D of deformable side portions 604, 704, and 804 of FIGS. 6, 7 and 8, respectively, may be about three eighths inch to one inch. Other dimensions may be used. The exact width D may be chosen based on a groove width G (see FIG. 6*b*) of a groove web to contain the housing. Width D may be chosen to exceed G, so that deformation takes place during insertion of the housing in the groove.

In some embodiments, widths C and C' of top retaining portion upper and lower surfaces, respectively, may be greater than about one inch. Other dimensions may be used.

Figure 9:
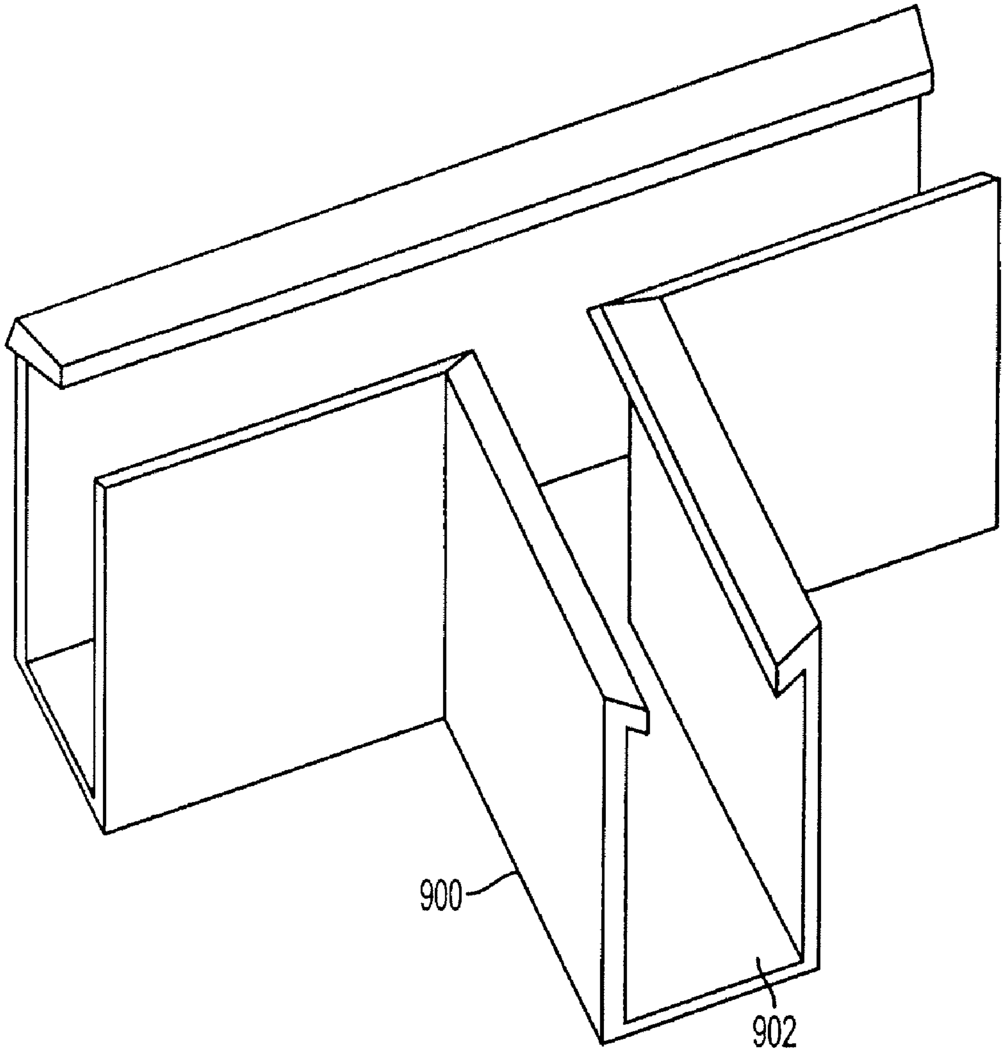
FIG. 9 illustrates a perspective view of a T-segment of a loop sensor housing, configured in accordance with various embodiments of the invention.

FIG. 9 illustrates a perspective view of a T-segment 900 of a loop sensor housing, configured in accordance with various embodiments of the invention. T-segment 900 is one example of segment 206 illustrated in plan view in FIG. 2. In this embodiment, T-segment 900 includes a hollow portion 902. Hollow portion 902 may accommodate sensor wire turns in a manner that allows small relative displacements of T-segment 900 with respect to wire turns. In this manner, a prefabricated loop sensor containing T-segment 900 may be adjusted with small relative motions of T-segment 900 (not shown) when placed within a groove web, if necessary to account for slight differences in dimension between a groove web and prefabricated loop sensor.

Figure 10:
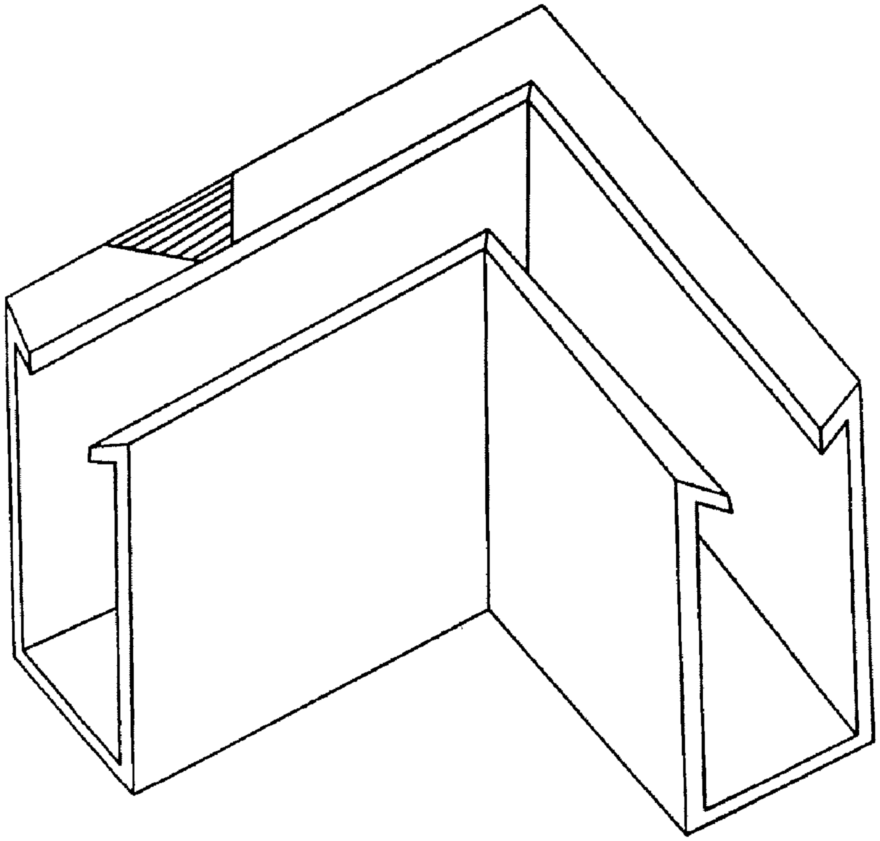
FIG. 10 illustrates a perspective view of an L-segment of a loop sensor housing, configured in accordance with various embodiments of the invention.

FIG. 10 illustrates an L-shaped loop sensor housing corner portion 1000, arranged according to various embodiments of the invention. Corner portion 1000 may be configured to enclose loop sensor wire windings that are bent in a corner region of a planar pattern of a loop sensor. In this case, a right angle corner is formed.

Figure 10A:
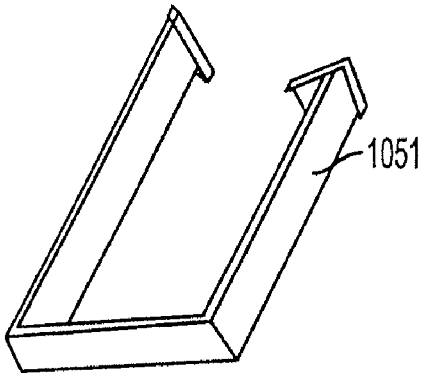
FIG. 10*a* illustrates a clip that may be used with a loop sensor assembly according to various embodiments of the invention.

FIG. 10*a* illustrates a clip 1051 that may be used with a loop sensor assembly according to various embodiments of the invention. For example, clip 1051 or other clips fasteners, or other elements may be used to secure loop sensor housing elements together.

Figure 11:
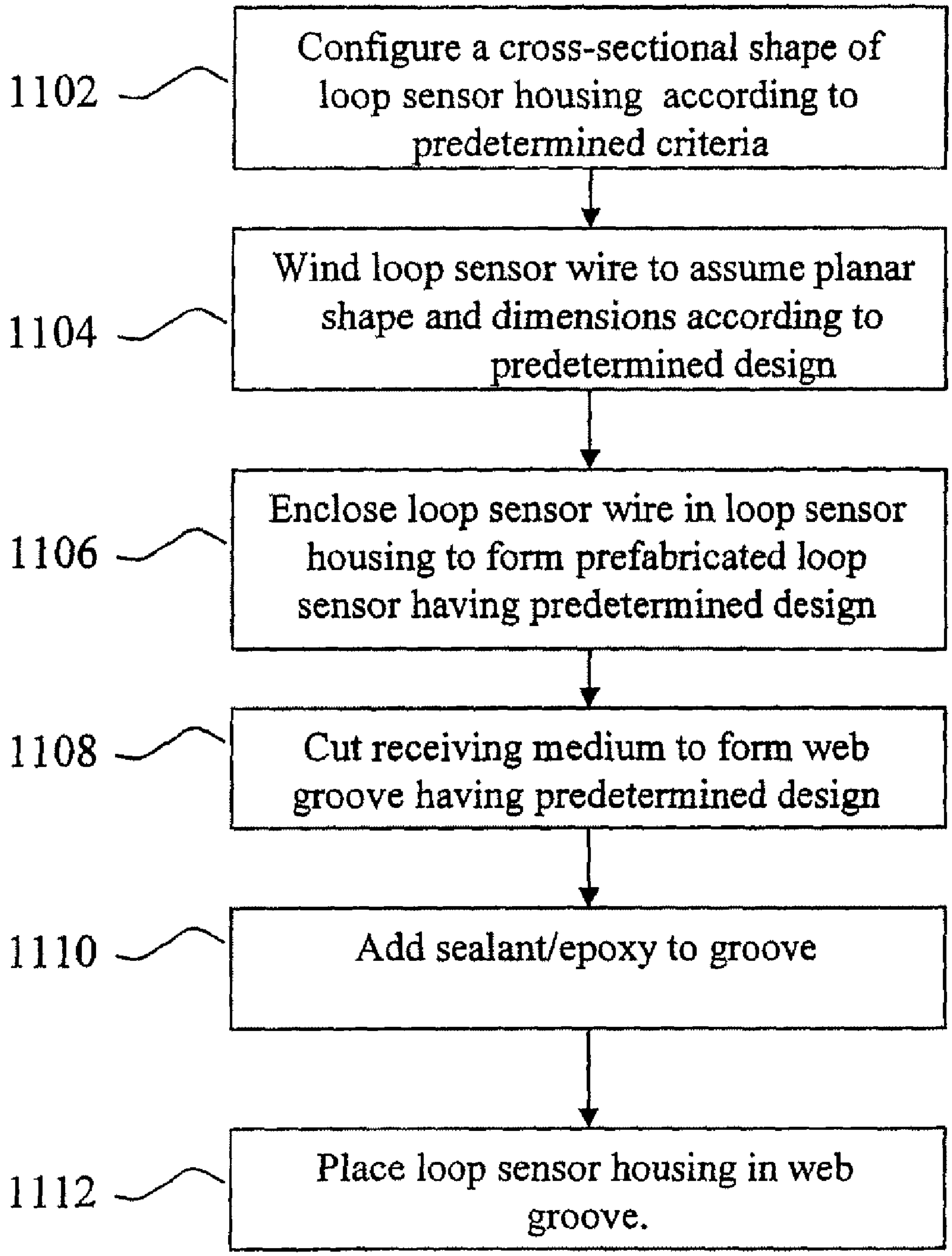
FIG. 11 illustrates exemplary steps involved in a method for installing a ferromagnetic loop sensor, according to one embodiment of the present invention.
Figure 12:
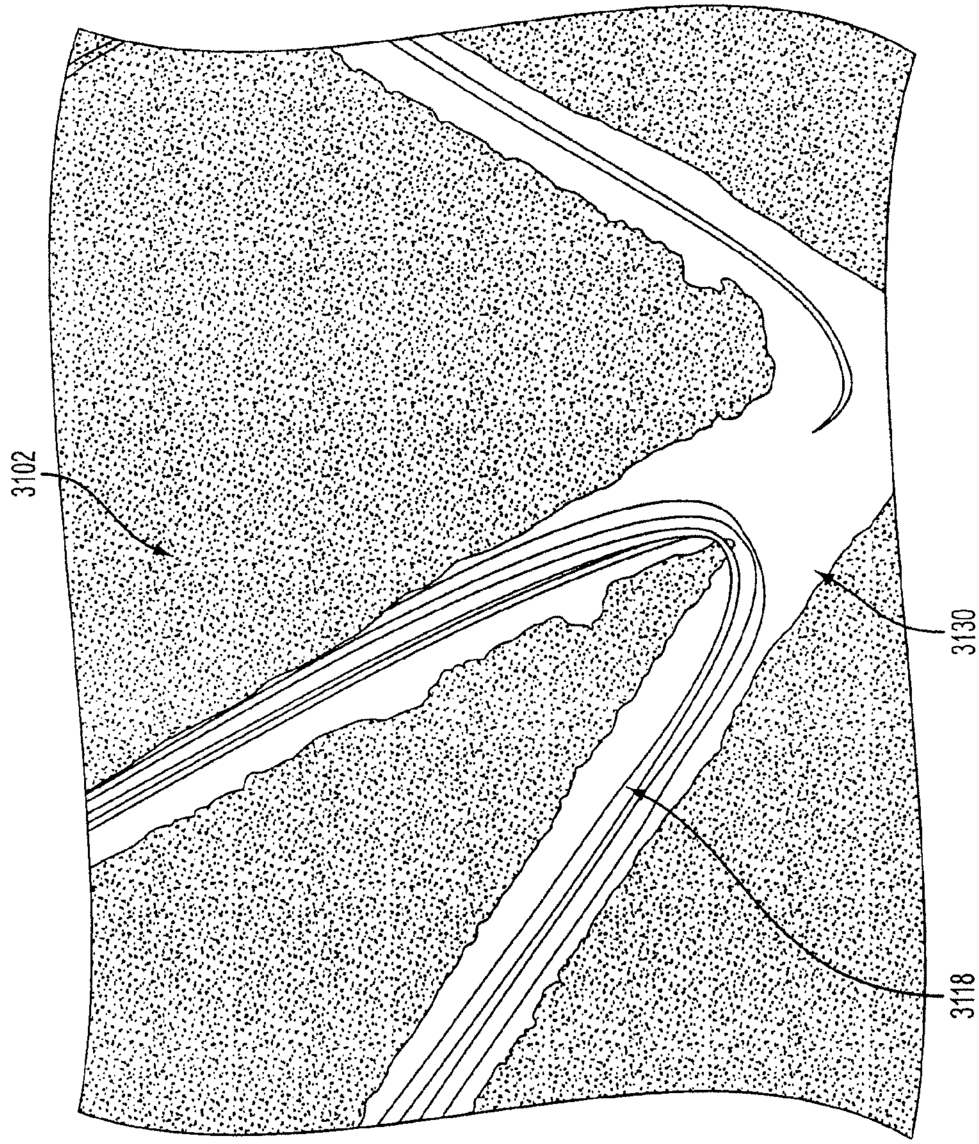
FIG. 12 illustrates of a details of a loop sensor wire arranged in a groove in a pavement.
Figure 13:
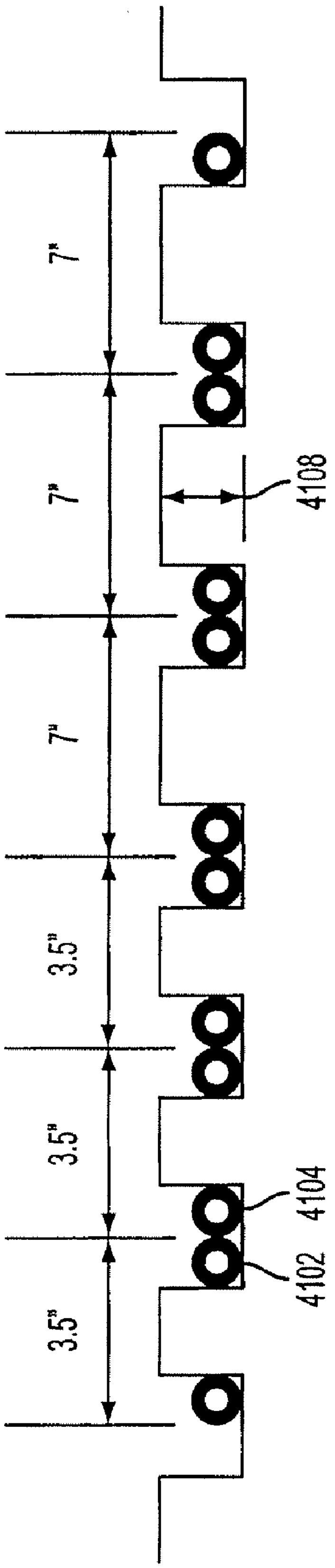
FIG. 13 illustrates a cross-sectional view of a loop sensor wire in a groove.
Figure 14:
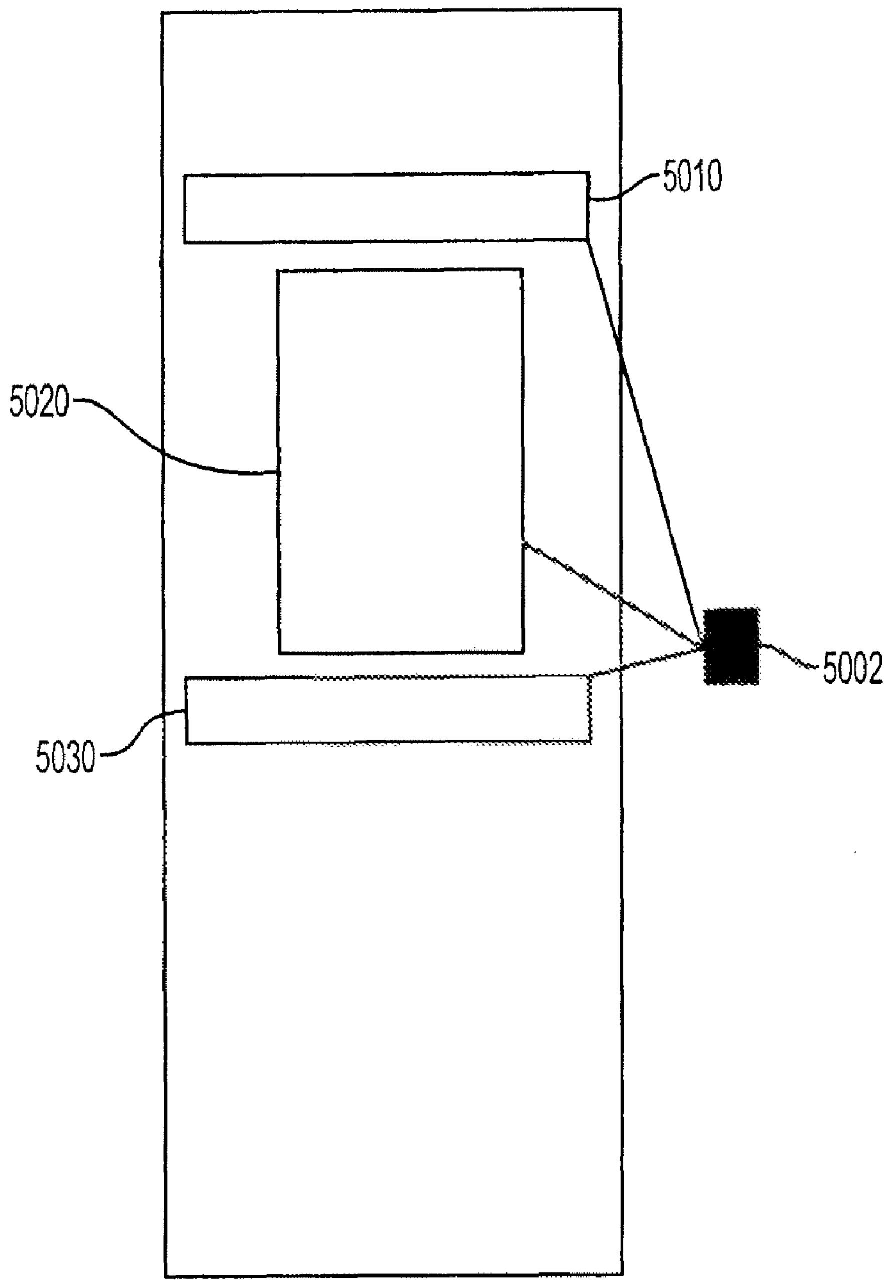
FIG. 14 illustrates a loop sensor wire pattern.

FIG. 11 illustrates exemplary operations involved in a method for installing a loop sensor, according to various embodiments of the invention. In operation 1102, a loop sensor housing cross-section is configured according to a predetermined criteria. For example, one criterion is a design depth below a road surface of loop sensor wires to be housed in the loop sensor. By establishing a design depth, a loop sensor housing cross-sectional shape can be tailored to include wire guides that serve to locate the loop sensor wires at the design depth when the housing is installed in a roadbed, as discussed above.

In operation 1104, a continuous wire is wound to form an induction loop pattern whose shape and size are configured to match a predetermined pattern for the loop sensor. For example, the wire winding can be done in a housing having the dimensions and shape of the predetermined pattern. In some embodiments, the pattern is may be one chosen from the loop sensor patterns disclosed in the '972 application. For example, the pattern can be a series of contiguous polygons that define an overall footprint itself having a polygonal shape. Other patterns may be used. The housing can be a loop sensor housing to permanently house the loop sensor wire, or a housing used only to help shape the loop sensor wires.

In operation 1106, the loop sensor wire is enclosed within a loop sensor housing. In some embodiments, the loop sensor wire is placed within wire guides configured to hold a plurality of loop sensor wire turns. In some embodiments, the loop sensor wires are placed within the wire guides when partially separable portions of the loop sensor housing are opened to receive the wires, and subsequently fastened together.

In operation 1108, a receiving medium, such as for example, a roadbed at a data collection location is cut to assume a planar shape of the predetermined pattern. A depth of a groove web so formed is configured to exceed a cross-sectional depth of the loop sensor housing, which is in turn determined by a position of a top retaining lip of the loop sensor housing.

In operation 1110, sealant, epoxy, adhesive, and/or other substance may be added to the groove to aid in retaining the loop sensor assembly and/or to provide other features. As discussed above, the aforementioned sealant, epoxy, adhesive, or other substance may interact with protrusions on a loop sensor housing (e.g., protrusions 651) to aid in securing and/or locking a loop sensor assembly in place.

In operation 1112, the loop sensor housing is inserted into the groove web. The loop sensor housing can be a single continuous piece, or a series of housing segments. In the latter case, the relative position of housing segments can be adjusted slightly as necessary during insertion into the groove.

In some embodiments, a cap or other portion of the inserted loop sensor assembly that protrudes above the roadway surface may be "ground off" or otherwise removed. However, in some embodiments, this may not be necessary.

Multiple advantages accrue to a loop sensor system constructed using configurations of the prefabricated loop sensor and methods of installation disclosed above. Both time and effort involved in installation of a loop sensor in a roadbed are substantially reduced, since winding of a loop sensor wire within a groove web of the roadbed is avoided. In addition, embodiments of this invention, using a loop sensor housing that contains a retaining lip and wire guides, provide for placement of a loop sensor wire at a well defined and reproducible depth with respect to a roadway surface. Furthermore, the relative position of horizontally spaced or vertically stacked wire turns in a loop sensor containing multiple wire turns, can be precisely controlled with the use of wire guides.

The foregoing disclosure has been presented for purposes of illustration and description. It is not intended to be exhaustive or to limit the invention to the precise forms disclosed. Many variations and modifications of the embodiments described herein will be apparent to one of ordinary skill in the art in light of the above disclosure. The scope of the invention is to be defined only by the claims appended hereto, and by their equivalents.

Further, in describing embodiments of the present invention, the specification may have presented the method and/or process of the present invention as a particular sequence of operations. However, to the extent that the method or process does not rely on the particular order of operations set forth herein, the method or process should not be limited to the particular sequence of operations described. As one of ordinary skill in the art would appreciate, other sequences of operations may be possible. Therefore, the particular order of the operations set forth in the specification should not be construed as limitations on the claims. In addition, the claims directed to the method and/or process of the present invention should not be limited to the performance of their operations in the order written, and one skilled in the art can readily appreciate that the sequences may be varied and still remain within the spirit and scope of the present invention.

What is claimed is:

1. A housing for installation of a loop sensor in a receiving medium under a top surface of the receiving medium, wherein the loop sensor includes a wire, the housing comprising:

a hollow portion of the housing configured to receive the wire of the loop sensor therein such that, responsive to installation of the housing in the receiving medium, the hollow portion of the housing provides a sensor path for the wire of the loop sensor through the receiving medium, the sensor path having a sensor shape in the plane of the top surface of the receiving medium;

one or more protrusions, extending outward from the housing, configured to secure the housing within the receiving medium; and a retaining lip disposed at or near a first end of the housing, wherein the retaining lip is configured such that responsive to installation of the housing in the receiving medium, the retaining lip engages the top surface of the receiving medium to maintain the wire of the loop sensor in the hollow portion of the housing at a predetermined depth below the top surface in the receiving medium.

2. The housing of claim 1, further comprising a deformable side portion configured to contact the receiving medium when the housing is installed in the receiving medium.

3. The housing of claim 1, further comprising sidewalls that extend from the retaining lip toward a second end of the housing that is opposite the first end, and wherein the retaining lip is formed integrally as a single contiguous element with the sidewalls.

4. The housing of claim 3, wherein the retaining lip extends outward from the sidewalls in two opposite directions.

5. The housing of claim 1, wherein the one or more protrusions comprise a deformable material.

6. The housing of claim 1, wherein the retaining lip runs the entire length of the sensor path.

7. The housing of claim 1, further comprising a closable opening formed at or near a second end of the housing that is opposite the first end by separable portions, wherein the closable opening is configured to closably open to receive the wire of the loop sensor into the hollow portion of the housing for installation therein.

8. The housing of claim 1, wherein the hollow portion of the housing has a cross-section of about one-quarter of an inch by about one inch.

9. The housing of claim 1, further comprising a set of wire guides formed within the housing, the wire guides being configured to hold the wire of the loop sensor within the housing.

10. The housing of claim 9, further comprising sidewalls that extend from the retaining lip toward a second end of the housing that is opposite the first end, wherein the sidewalls form, in part, the hollow portion of the housing, and wherein the set of wire guides comprises a set of stacked protrusions that extend into the hollow portion of the housing from the sidewalls.

11. The housing of claim 9, wherein the wire of the loop sensor makes multiple turns around the path of the housing, and wherein the set of wire guides are configured to hold the wire turns individually.

12. A housing for installation of a loop sensor in a receiving medium under a top surface of the receiving medium, wherein the loop sensor includes a wire, the housing comprising:

a hollow portion of the housing configured to receive the wire of the loop sensor therein such that, responsive to installation of the housing in the receiving medium, the hollow portion of the housing provides a sensor path for the wire of the loop sensor through the receiving medium, the sensor path having a sensor shape in the plane of the top surface of the receiving medium;

a retaining lip disposed at or near a first end of the housing, wherein the retaining lip is configured such that responsive to installation of the housing in the receiving medium, the retaining lip engages the top surface of the receiving medium to maintain the wire of the loop sensor in the hollow portion of the housing at a predetermined depth below the top surface in the receiving medium; and a closable opening formed by separable portions at or near a second end of the housing that is opposite the first end, wherein the closable opening is configured to closably open to receive the wire of the loop sensor into the hollow portion of the housing for installation therein.

13. The housing of claim 12, further comprising sidewalls that extend from the retaining lip toward the second end of the housing that is opposite the first end, and wherein the retaining lip is formed integrally as a single contiguous element with the sidewalls.

14. The housing of claim 13, wherein the retaining lip extends outward from the sidewalls in two opposite directions.

15. The housing of claim 13, wherein the closable opening is formed between the sidewalls.

16. The housing of claim 12, wherein the closable opening runs the entire length of the sensor path.

17. The housing of claim 12, wherein the hollow portion of the housing has a cross-section of about one-quarter of an inch by about one inch.

18. The housing of claim 12, further comprising a set of wire guides formed within the housing, the wire guides being configured to hold the wire of the loop sensor within the housing.

19. The housing of claim 18, further comprising sidewalls that extend from the retaining lip toward a second end of the housing that is opposite the first end, wherein the sidewalls form, in part, the hollow portion of the housing, and wherein the set of wire guides comprises a set of stacked protrusions that extend into the hollow portion of the housing from the sidewalls.

20. The housing of claim 18, wherein the wire of the loop sensor makes multiple turns around the path of the housing, and wherein the set of wire guides are configured to hold the wire turns individually.

* * * * *